United States Patent [19]

Kitazawa

[11] Patent Number: 5,436,865
[45] Date of Patent: Jul. 25, 1995

[54] OUTPUT CIRCUIT FOR SEMICONDUCTOR MEMORY DEVICE REALIZING EXTENDED DATA OUTPUT UPON INACTIVATION OF CAS SIGNAL

[75] Inventor: Eiji Kitazawa, Kanagawa, Japan

[73] Assignee: NEC Corporation, Tokyo, Japan

[21] Appl. No.: 207,164

[22] Filed: Mar. 8, 1994

[30] Foreign Application Priority Data

Mar. 8, 1993 [JP] Japan .................. 5-046197

[51] Int. Cl.⁶ .............................. G11C 7/00
[52] U.S. Cl. ..................... 365/194; 365/189.05; 365/189.08; 365/193; 365/230.08; 365/233; 365/238.5
[58] Field of Search ........... 365/189.05, 194, 189.08, 365/193, 230.08, 233, 238.5

[56] References Cited

U.S. PATENT DOCUMENTS

| | | | |
|---|---|---|---|
| 4,586,167 | 4/1986 | Fujishima et al. | 365/238.5 |
| 5,022,011 | 6/1991 | Allan | 365/233 |
| 5,264,737 | 11/1993 | Oikawa | 307/265 |
| 5,305,271 | 4/1994 | Watanabe | 365/205 |
| 5,325,330 | 6/1994 | Morgan | 365/189.05 |

Primary Examiner—Joseph A. Popek
Assistant Examiner—Andrew Q. Tran
Attorney, Agent, or Firm—Sughrue, Mion, Zinn, Macpeak & Seas

[57] ABSTRACT

In an output circuit for a semiconductor memory, configured to continue to output a memory data even if a column address strobe signal supplied from an external device to the semiconductor memory is disabled, a logic circuit receiving the column address strobe signal generates a latch signal which is inactivated immediately when the column address strobe signal is enabled but which is activated with a delay when the column address strobe signal is disabled. A latch circuit latches a read amplifier output signal in response to the latch signal, and an output buffer receives an output of the latch circuit to output a data signal.

6 Claims, 6 Drawing Sheets

OUTPUT CIRCUIT FOR SEMICONDUCTOR MEMORY DEVICE REALIZING EXTENDED DATA OUTPUT UPON INACTIVATION OF CAS SIGNAL

BACKGROUND OF THE INVENTION

1. Field of the Invention

The present invention relates to an output circuit for a semiconductor memory, and more specifically to an output-data latch circuit for latching a memory read-out signal when a column address strobe signal is inactivated.

2. Description of Related Art

In a so-called page cycle, during a period in which a row address strobe signal $\overline{RAS}$ is maintained a active, namely, at a low level, a column address strobe signal $\overline{CAS}$ is alternately activated and inactivated a plurality of times, so that data on memory cells located on a word line selected when the row address strobe signal $\overline{RAS}$ is brought to the low level are consecutively read out. According to this page cycle, the memory cell data can be read in one cycle of the column address strobe signal $\overline{CAS}$, the data on one word can be effectively read out for a short time. Therefore, this page cycle has been widely utilized.

In this page cycle, however, when the column address strobe signal $\overline{CAS}$ is brought to a high level, an output data is disabled. Therefore, if the cycle period of the column address strobe signal $\overline{CAS}$ is shortened, an effective period of the 1 output is correspondingly shortened, and accordingly, it has become difficult to control an external device. Under this circumstance, there has been recently developed a semiconductor memory having an extended output function capable of maintaining an output data selected when the column address strobe signal $\overline{CAS}$ is brought to the low level, even after the column address strobe signal $\overline{CAS}$ is brought to the high level, Referring to FIG. 1, there is shown a block diagram illustrating one example of a semiconductor memory having an output circuit.

Figure 1:
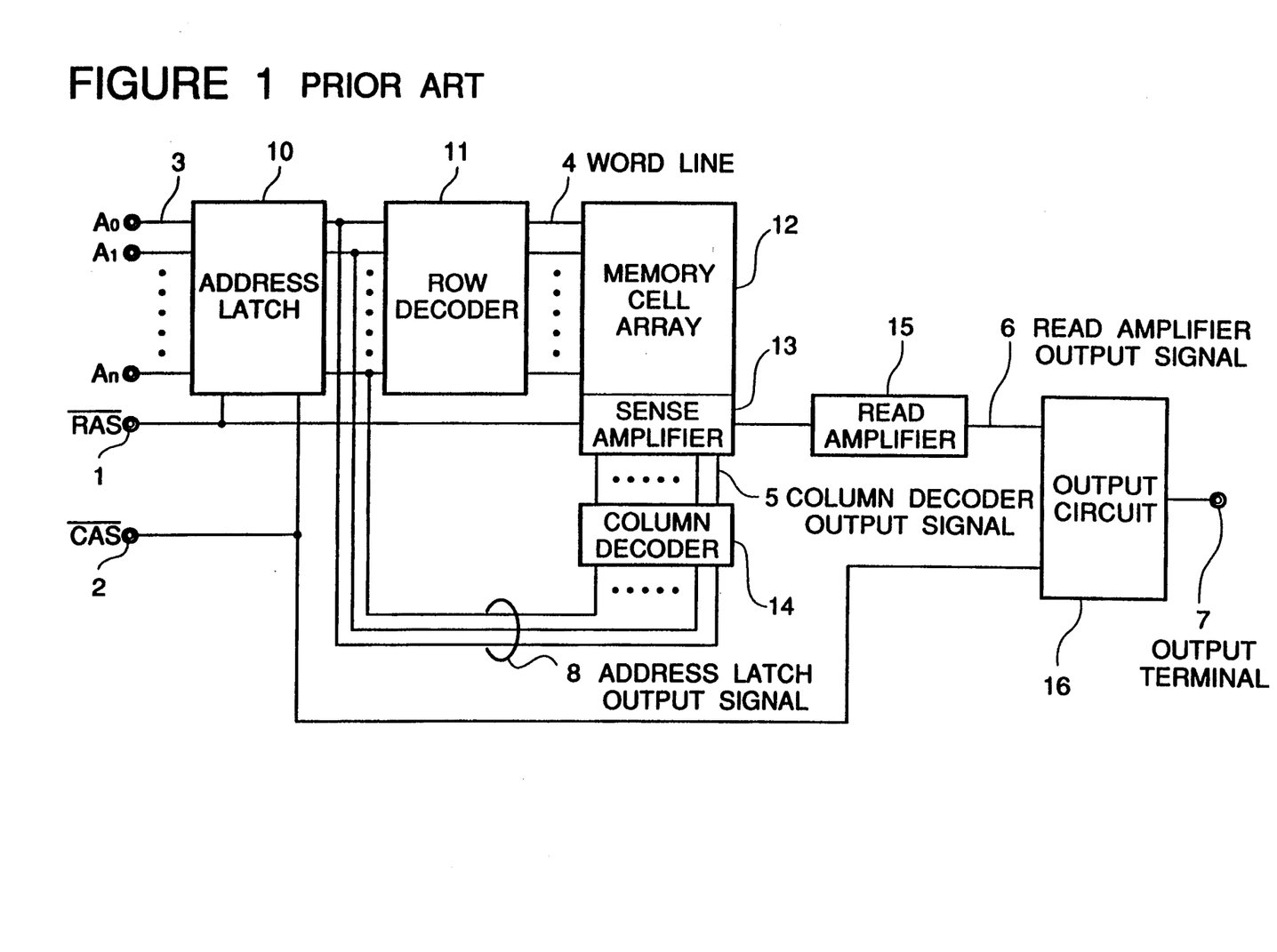
FIG. 1 is a block diagram illustrating one example of a semiconductor memory having an output circuit.

The semiconductor memory shown in FIG. 1 includes a memory cell array 12 composed of a number of memory cells arranged in the form of a matrix having a plurality of rows and a plurality of columns. The semiconductor memory also includes a plurality of address input terminals 3 for receiving an external address of $A_0$ to $A_n$, which is supplied to an address latch circuit 10. The address signal 8 latched in the address latch 10 is supplied to and decoded by an row decoder 11. The row decoder 11 has outputs of the number corresponding to the number of the rows of the memory cell array 12, and each of the outputs of the row decoder 11 is connected to a word line 4 of a corresponding row of the memory cell array 12, so as to select a designated row from the plurality of rows of the memory cell array 12.

The shown semiconductor memory also includes a number of sense amplifiers 13 each connected to a corresponding column or the plurality of columns of the memory cell array 12, and a column decoder 14 connected to receive the output 8 of the address latch 10 and having a plurality of outputs 5 connected to corresponding columns of the memory cell array 12, respectively, so as to select a designated column from the plurality of columns of the memory cell array 12. An output of the sense amplifier 13 connected to the column selected by the column decoder 14 is supplied to a read amplifier 14, which in turn has an output 6 connected to an output circuit 16. An output of the output circuit 16 is connected to an output terminal 7.

A row address strobe signal $\overline{RAS}$ on an input terminal 1 is supplied to the address latch 10 and the sense amplifier 13, and the column address strobe signal $\overline{CAS}$ on an input terminal 2 is also supplied to the address latch 10 and the output circuit 16.

Since the above mentioned construction of the semiconductor memory is fundamental and well known to persons skilled in the art, further detailed explanation of the construction and description of operation will be omitted.

Figure 2:
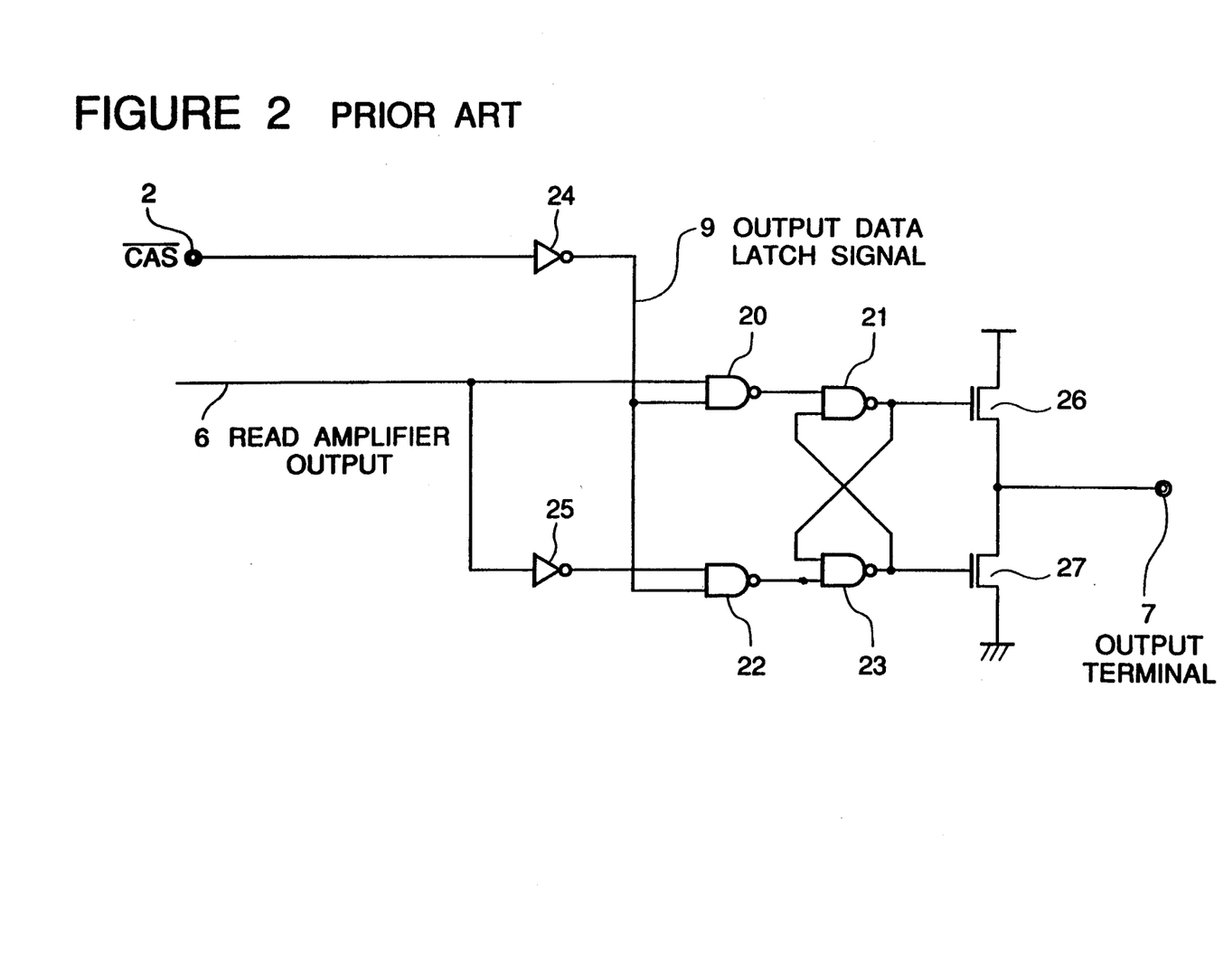
FIG. 2 is a logic circuit diagram of a conventional output circuit having an extended function, which is incorporated as the output circuit in the semiconductor memory shown in FIG. 1.

Referring to FIG. 2, there is shown a logic circuit diagram of a conventional output circuit having an extended function, which is incorporated as the output circuit 16 in the semiconductor memory shown in FIG. 1. The shown output circuit is configured to receive the output 6 of the read amplifier 16 and the column address strobe signal $\overline{CAS}$ and to output an output data to the output terminal 7.

The shown output circuit includes an inverter 24 receiving the column address strobe signal $\overline{CAS}$, and another inverter 25 receiving the output 6 of the read amplifier 16. An output of the inverter 24 constitutes an output data latch signal 9, which is supplied to one input of each of two NAND gates 20 and 22. The output 6 of the read amplifier 16 is supplied to the other input of the NAND gate 20, and an output of the inverter 25 is supplied to the other input of the NAND gate 22 as a data signal complimentary to the data signal supplied to the NAND gate 20. An output of the NAND gate 20 is connected to one input of a NAND gate 21, and an output of the NAND gate 22 is connected to one input of a NAND gate 23. An output of the NAND gate 21 is connected to the other input of the NAND gate 23, and an output of the NAND gate 23 is connected to the other input of the NAND gate 21. Thus, a flipflop is formed by a pair of NAND gates 21 and 23, and a data latch circuit is constituted of the four NAND gates 20, 21, 22 and 23.

Figure 3:
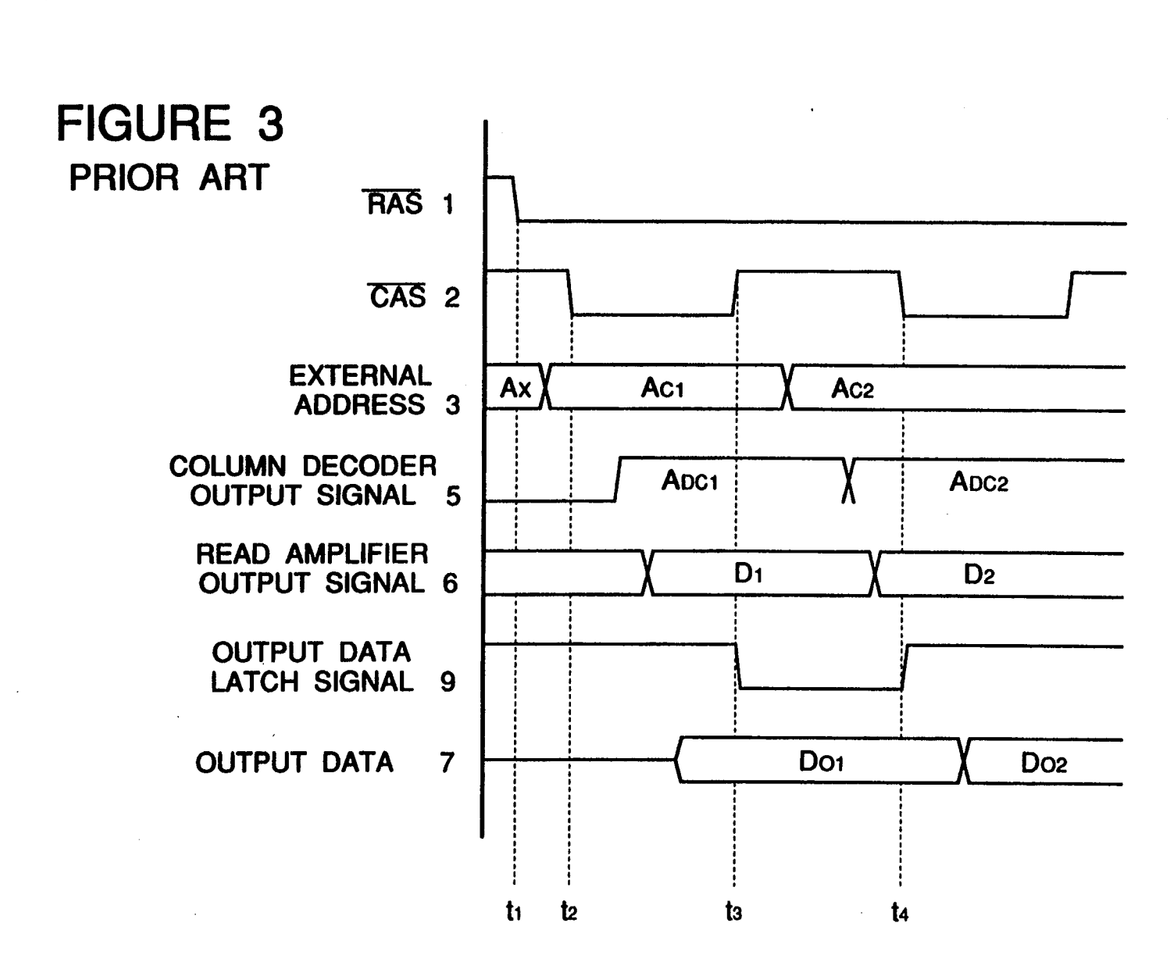
FIG. 3 is a timing chart for illustrating an operation of the semiconductor memory incorporating therein the output circuit shown in FIG. 2.

The output of the NAND gates 21 and 23 are connected to a gate of a pair of field effect transistors 26 and 27, connected in series between a positive power supply voltage and the ground. A connection node between the series-connected field effect transistors 26 and 27 is connected to the output terminal 7:

Referring to FIG. 3, there is shown a timing chart of the row address strobe signal $\overline{RAS}$, the column address strobe signal $\overline{CAS}$, external address ($A_0$ to $A_n$), the column decoder output signal 5, the read amplifier output signal 6, the output data latch signal 9.

Operation of the semiconductor memory will be described with reference to FIGS. 1, 2 and 3.

If the row address strobe signal $\overline{RAS}$ is brought to the low level at the time $t_1$, the external address ($A_0$ to $A_n$) is latched in the address latch 10 as a row address $A_x$, and therefore, the row decoder 11 selects or activates one word line of the plurality of word lines 4. Thereafter, the sense amplifier 13 is activated, so that information of memory cells on the selected word line is amplified. At the time $t_2$, if the column address strobe signal $\overline{CAS}$ is brought to the low level, the external address ($A_0$ to $A_n$) is latched in the address latch 10 as a column address $A_{C1}$, and therefore, the column decoder 14 outputs an output $A_{DC1}$ so as to select a designated bit line, so that the information of the designated memory cell is outputted through the read amplifier 15 to the output circuit 16 as data $D_1$.

At this time, since the column address strobe signal $\overline{CAS}$ is at the low level, the data latch signal 9 is at the high level. Therefore, the data latch circuit constituted of the four NAND gates 20, 21, 22 and 23 is put in a pass-through condition, so that the output $D_1$ of the read amplifier 15 is outputted from the output terminal 7 as an output data $D_{O1}$.

Thereafter, if the column address strobe signal $\overline{CAS}$ is brought to the high level, an external address $A_{C2}$ to be used in a next read cycle is supplied, and the column decoder 15 selects the bit line corresponding the newly supplied external address $AC_2$. Accordingly, a new memory cell data is supplied through the read amplifier 15 to the output circuit 16.

In this process, the output circuit 16 continues to output the memory cell information selected when the column address strobe signal $\overline{CAS}$ is brought to the low level, during a period in which the column address strobe signal $\overline{CAS}$ is maintained at the high level, namely, during an extended outputting period. Accordingly, the previous output data $D_{O1}$ is maintained even after the column address strobe signal $\overline{CAS}$ is brought to the high level until the time $t_4$ where the column address strobe signal $\overline{CAS}$ is brought to the low level for a next cycle.

After the time $t_4$, the memory cell information selected by the column address $AC_2$ is amplified the read amplifier 15 and outputted through the output circuit 16 to the output terminal as the output data $D_{O2}$.

As will be apparent from the above, the above mentioned function-extended output circuit of the semiconductor memory is configured so that just after the rising of the column address strobe signal $\overline{CAS}$, the memory cell data is latched in the output circuit. Accordingly, in the case that the column address is setup time is short with reference to the falling of the column address strobe signal $\overline{CAS}$, if the column address strobe signal $\overline{CAS}$ is brought of the high level during a period after an address is supplied and a memory cell is selected until information of the selected memory cell is supplied through the read amplifier to the output circuit, the selected memory cell information cannot be outputted. Because of this, the column address strobe signal $\overline{CAS}$ has to be maintained at the low level which is longer than the ordinary case. In other words, the low level period of the column address strobe signal $\overline{CAS}$ is restricted by the column address setup time, and therefore, cannot be shortened.

This means that the cycle of the column address strobe signal $\overline{CAS}$ itself for reading the memory cell data can be made shorter than that of a semiconductor memory having no extended output function

SUMMARY OF THE INVENTION

Accordingly, it is an object of the present invention to provide an output circuit for a semiconductor memory which has overcome the above mentioned defect of the conventional one.

Another object of the present invention is to provide an output circuit for a semiconductor memory, capable of reading out memory cell data for a shortened time.

Still another object of the present invention is to provide an output circuit for a semiconductor memory, capable of consecutively reading out data of memory cells on the same row for a shortened time.

The above and other objects of the present invention are achieved in accordance with the present invention by an output circuit for a semiconductor memory, configured to continue to output a memory data even if a column address strobe signal supplied from an external to the semiconductor memory is disabled, wherein the improvement including a circuit receiving the column address strobe signal for generating a latch signal which is changed immediately when the column address strobe signal is enabled but which is changed with a delay when the column address strobe signal is disabled, a latch circuit receiving a read amplifier output signal obtained by amplifying a memory cell information, for latching the read amplifier output signal in response to the latch signal, and an output buffer receiving an output of the latch circuit.

The above and other objects, features and advantages of the present invention will be apparent from the following description of preferred embodiments of the invention with reference to the accompanying drawings.

DESCRIPTION OF THE PREFERRED EMBODIMENTS

Figure 4:
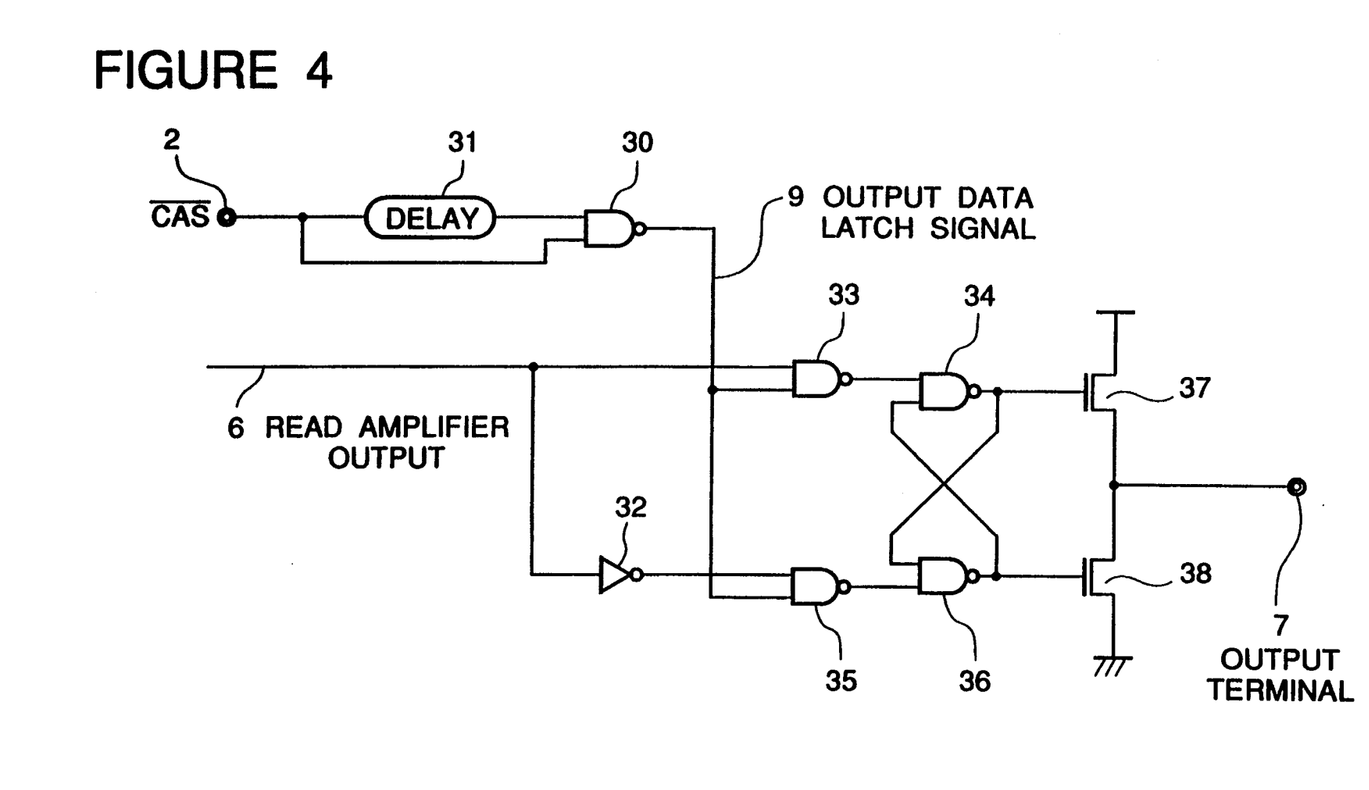
FIG. 4 is a logic circuit diagram of a first embodiment of the output circuit in accordance with the present invention having an extended function, which is incorporated as the output circuit in the semiconductor memory shown in FIG. 1.

Referring to FIG. 4, there is shown a logic circuit diagram of a first embodiment of the output circuit in accordance with the present invention having extended function, which can be incorporated as the output circuit 16 in the semiconductor memory shown in FIG. 1.

The first embodiment of the output circuit includes a two-input NAND 30 having a first input directly receiving the column address strobe signal $\overline{CAS}$, and a second input receiving through a delay circuit 31 the column address strobe signs $\overline{CAS}$. An output of the NAND 30 constitutes an output data latch signal 9, which is supplied to one input of each of two NAND gates 33 and 35. The output 6 of the read amplifier 16 is supplied to the other input of the NAND gate 33, and also through an inverter 32 to the other input o the NAND gate 35. Therefore, the NAND gate 35 receives a data signal complimentary to the data signal supplied to the NAND gate 33.

An output of the NAND gate 33 is connected to one input of a NAND gate 34, and an output of NAND gate 35 is connected to one input of a NAND gate 36. An output of the NAND gate 34 is connected to the other input of the NAND gate 36, and an output of the NAND gate 36 is connected to the other input of the NAND gate 34. Therefore, a flipflop is formed by a pair of NAND gates 34 and 36, and a data latch circuit is constituted of the four NAND gates 33, 34, 35 and 36.

The output of the NAND gates 34 and 36 are connected to a gate of a pair of field effect transistors 37 and 38 connected in series between a positive power supply voltage and the ground. A connection node between the series-connected field effect transistors 37 and 38 is connected to the output terminal 7. The pair of field effect transistors 37 and 38 constitute an output buffer.

Figure 5:
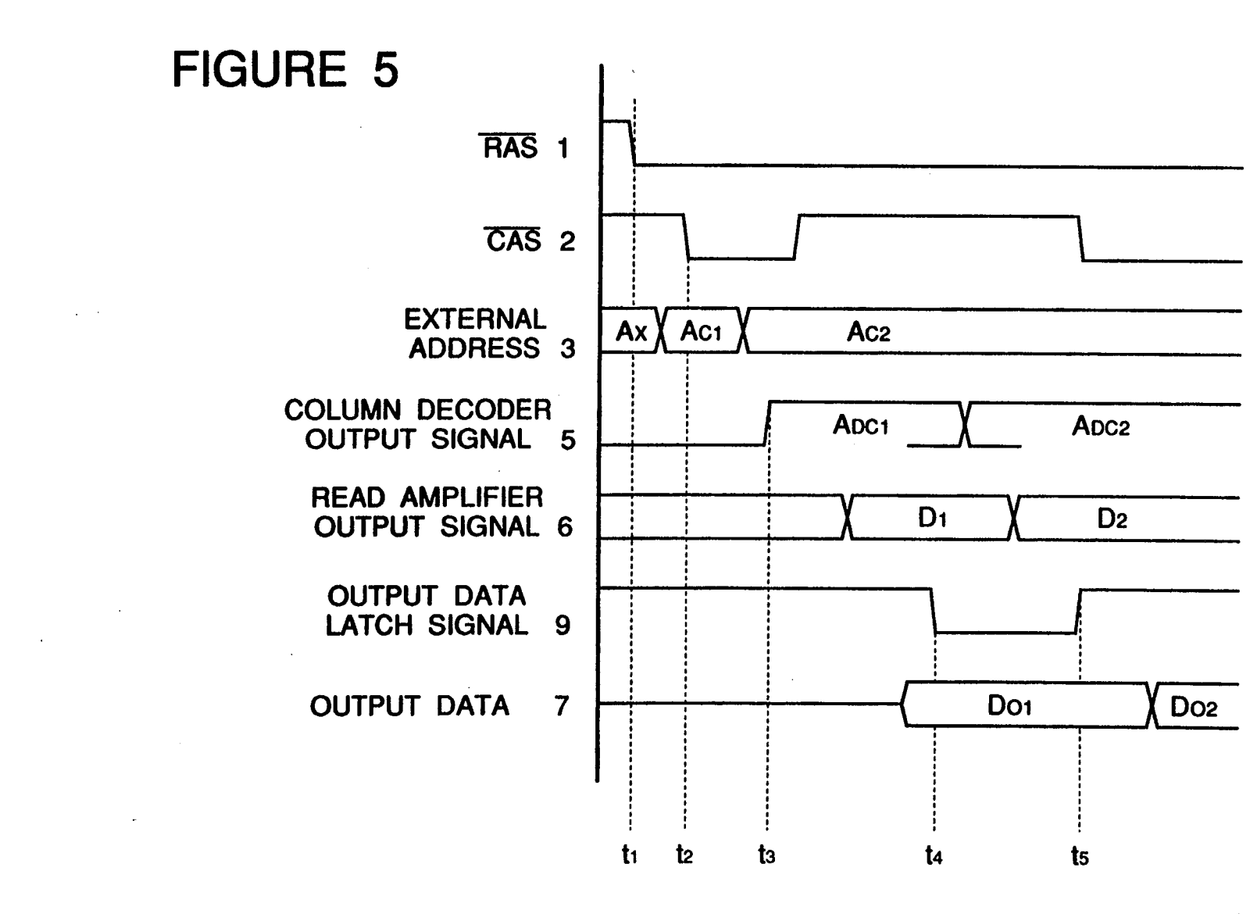
FIG. 5 is a timing chart for illustrating an operation of the semiconductor memory incorporating therein the output circuit in accordance with the present invention shown in FIG. 4.

Referring to FIG. 5, there is shown a timing chart of the row address strobe signal $\overline{RAS}$, the column address strobe signal $\overline{CAS}$, the external address ($A_0$ to $A_n$), the column decoder output signal 5, the read amplifier output signal 6, the output data latch signal 9 in the circuits shown in FIGS. 1 and 4.

Operation of the semiconductor memory shown in FIG. 1 incorporating the output circuit shown in FIG. 4, will be described with reference to FIGS. 1, 4 and 5.

If the row address strobe signal $\overline{RAS}$ is brought to the low level at the time $t_1$, the external address ($A_0$ to $A_n$) is latched in the address latch 10 as a row address $A_x$, and therefore, the row decoder 11 selects or activates one word line of the plurality of word lines 4. Thereafter, the sense amplifier 13 is activated, so that all information of memory cells on the selected word line is amplified.

At the time $t_2$, if the column address strobe signal $\overline{CAS}$ is brought to the low level, the external address ($A_0$ to $A_n$) is latched in the address latch 10 as a column address $A_{C1}$. In this case, the setup time of the column address $A_{C1}$ is sufficiently short with reference to the falling of the column address strobe signal $\overline{CAS}$.

At the time $t_3$, an output $A_{DC1}$ of the column decoder 14 becomes fixed so as to select a designated bit line, so that the information of the designated memory cell is outputted to the read amplifier 15. Thereafter, the column address strobe signal $\overline{CAS}$ is brought to the high level. However, as will be described hereinafter, the read amplifier 15 normally operates, the data $D_1$ is supplied to the output circuit 16.

Now, operation of the output circuit shown in FIG. 4 at the time of the rising of the column address strobe signal $\overline{CAS}$ will be described.

Differently from the circuit shown in FIG. 2 in which an inverted signal of the column address strobe signal $\overline{CAS}$ is used without modification as the output data latch signal, the circuit shown in FIG. 4 is constructed so that the column address strobe signal $\overline{CAS}$ itself and the column address strobe signal $\overline{CAS}$ delayed by the delay circuit 31 are supplied to the two-input NAND circuit 30, which in turn generates the output data latch signal 9. With this arrangement, the output data latch signal 9 makes it possible to allow the read amplifier output 6 to pass through the output circuit immediately when the column address strobe signal $\overline{CAS}$ is brought to the low level, but to cause the output circuit to latch the output data at the time $t_4$, namely, when a short time has elapsed after the column address strobe signal $\overline{CAS}$ is brought to the high level. Accordingly, even if the column address setup time is short, and even if the time length from the falling of the column address strobe signal $\overline{CAS}$ until the read amplifier output is actually supplied to the output circuit is long, it is possible to rise the column address strobe signal $\overline{CAS}$ to the high level at an early timing.

At the time $t_5$, the column address strobe signal $\overline{CAS}$ is brought to the low level, again. As a result, the output data latch signal is brought to the high level, so that the output $A_{DC2}$ of the column decoder 14 selected during the high level period of the column address strobe signal $\overline{CAS}$ is supplied as the output signal $D_2$ from the read amplifier 15 to the output circuit. At this time, since the output circuit is put in the pass-through condition immediately when the column address strobe signal $\overline{CAS}$ is brought to the low level, the output $D_2$ of the read amplifier 15 is outputted from the output terminal 7 as an output data $D_{O2}$.

Figure 6:
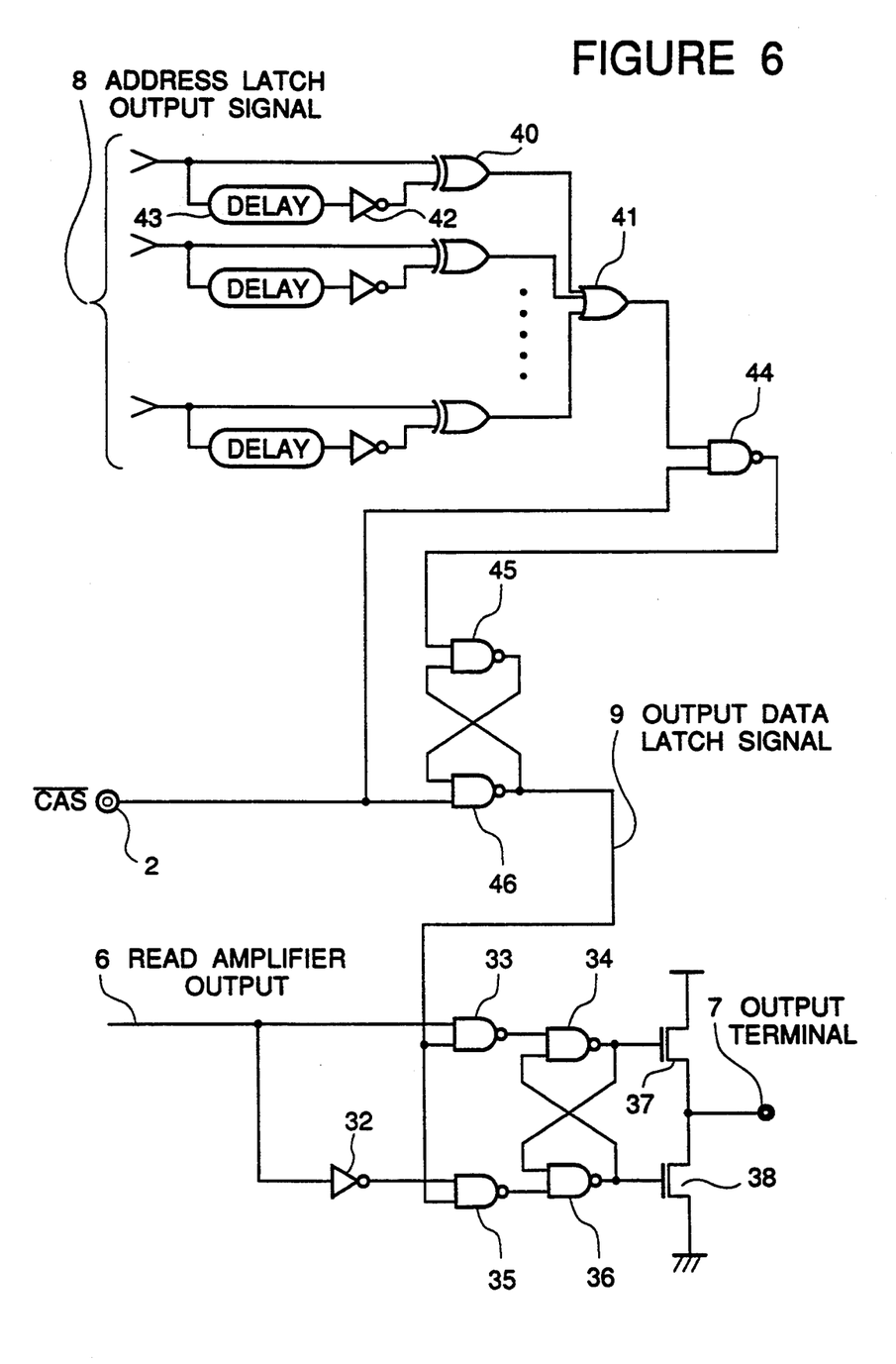
FIG. 6 is a logic circuit diagram of a second embodiment of the output circuit in accordance with the present invention having an extended function, which is incorporated as the output circuit in the semiconductor memory shown in FIG. 1.

Referring to FIG. 6, there is shown a logic circuit diagram of a second embodiment of the output circuit in accordance with the present invention having an extended function, which is incorporated as the output circuit in the semiconductor memory shown in FIG. 1. In FIG. 6, elements similar to those shown in FIG. 4 are given the same Reference Numerals, and explanation thereof will be omitted.

As will be apparent from comparison between FIGS. 4 and 6, the second embodiment includes, in place of the NAND gate 30 and the delay circuit 31 shown in FIG. 4, a number of two-input exclusive-OR gates 40 each having its one input receiving a corresponding bit of the address latch output signal 8, a number of delay circuits 43 each also receiving a corresponding bit of the address latch output signal 8 and having an output connected to an input of a associated inverter 42, which in turn has an output connected to the other input of a corresponding exclusive-OR gate 40. An output of all the exclusive-OR gates 40 are connected to an OR circuit, which has an output connected to one input of a two-input NAND gate 44, which has its other input connected to receive the column address strobe signal $\overline{CAS}$. An output of the NAND gate 44 is connected to one input of an NAND gate 45, and the column address strobe signal $\overline{CAS}$ is also supplied to one input of another NAND gate 46. An output of the NAND gate 45 is connected to the other input of the NAND gate 46, and an output of the NAND gate 46 is connected to the other input of the NAND gate 45. Accordingly, a set-reset flipflop is constituted of the two NAND gates 45, and 46. An output of the NAND gate 46 is connected to one input of each of two NAND gates 33 and 35.

With this arrangement, if any one bit of the output 8 of the address latch 10 which has latched the external address ($A_0$ to $A_n$) as the column address changes its logical level (from the high level to the low level or vice versa), the exclusive-OR gate 40 generates a one-shot high level, which is supplied through the OR gate 41 to the one -input of the NAND gate 44 which receives the column address strobe signal $\overline{CAS}$ at its other input. The set-reset flipflop constituted of the two NAND gates 45 and 46 is set and reset by the output of the NAND gate 44 and the column address strobe signal $\overline{CAS}$. An output of the set-reset flipflop, more specifically, an output of the NAND 46, constitutes an output data latch signal 9.

Thus, when the column address strobe signal $\overline{CAS}$ is brought to the high level, if no bit of the output 8 of the address latch 10 changes, the output data is not latched in the output circuit shown in FIG. 6. In addition, when any one bit of the output 8 of the address latch 10 changes, the output data latch signal 9 is generated at a timing later than the rising of the column address strobe signal $\overline{CAS}$, in comparison with the conventional example.

Accordingly, similarly to the first embodiment, even if the column address setup time is short, and even if the time length from the falling of the column address strobe signal $\overline{CAS}$ until the read amplifier output is actually supplied to the output circuit is long, it is allowed to rise the column address strobe signal $\overline{CAS}$ to the high level at an early timing.

As will be apparent from the above, the semiconductor memory output circuit in accordance with the present invention is characterized in that the read amplifier output data latched immediately when the column address strobe signal $\overline{CAS}$ is brought to high level. Accordingly, even if the column address setup time is short with reference to the falling of the column address strobe signal $\overline{CAS}$, the read amplifier output data can continue to be outputted from the rising of the column address strobe signal $\overline{CAS}$ until the output of the read amplifier has been fixed, and therefore, a desired output data can be latched in the output circuit. Accordingly, the low level period of the column address strobe signal $\overline{CAS}$ comes free of the restriction, and therefore, it is possible to shorten the cycle of the column address strobe signal $\overline{CAS}$ for reading each one memory cell data.

The invention has thus been shown and described with reference to the specific embodiments. However, it should be noted that the present invention is in no way limited to the details of the illustrated structures but changes and modifications may be made within the scope of the appended claims.

I claim:

1. An output circuit for a semiconductor memory, configured to continue to output memory data even if a column address strobe signal supplied from an external device to the semiconductor memory is disabled, wherein the improvement includes:
   a circuit receiving said column address strobe signal for generating a latch signal which is changed immediately when said column address strobe signal is enabled but which is changed with a delay when said column address strobe signal is disabled; and
   a latch circuit receiving a read amplifier output signal obtained by amplifying said memory data and receiving said latch signal, for latching said read amplifier output signal in response to said latch signal, and an output buffer receiving an output of said latch circuit, and
   wherein said circuit receiving said column address strobe signal includes a delay circuit receiving said column address strobe signal, and a logic gate having a first input receiving said column address strobe signal and a second input connected to an output of said delay circuit, said logic gate outputting said latch signal which is disabled immediately when said column address strobe signal is enabled but which is enabled with said delay when said column address strobe signal is disabled.

2. The output circuit claimed in claim 1, wherein said logic gate is a NAND gate outputting said latch signal which is brought to a high level immediately when said column address strobe signal is brought to a low level but which is brought to the low level with said delay when said column address strobe signal is brought to the high level.

3. An output circuit for a semiconductor memory, configured to continue to output memory data even if a column address strobe signal supplied from an external device to the semiconductor memory is disabled, wherein the improvement includes:
   a circuit receiving said column address strobe signal for generating a latch signal which is changed immediately when said column address strobe signal is enabled but which is changed with a delay when said column address strobe signal is disabled; and
   a latch circuit receiving a read amplifier output signal obtained by amplifying said memory data and receiving said latch signal, for latching said read amplifier output signal in response to said latch signal, and an output buffer receiving an output of said latch circuit, and
   wherein said circuit receiving said column address strobe signal includes a first logic gate circuit receiving a plurality of bits of address latch output signal for generating a one-shot logical signal when any one bit of said plurality of bits of address latch output signal changes its logical level, a second logic gate circuit receiving said one-shot logical signal and said column address strobe signal for generating a logic signal activated when said one-shot logical signal is generated and said column address strobe signal is inactivated, and a flipflop receiving said logic signal and said column address strobe signal so as to generate said latch signal which is not activated if said one-shot logical signal is generated and which is activated at a time later than said column address strobe signal is inactivated, when said one-shot logical signal is generated.

4. A semiconductor memory comprising:
   a memory cell array composed of a number of memory cells arranged in the form of a matrix having a plurality of rows and a plurality of columns;
   an address latch circuit receiving an external address composed of a plurality of bits, said address latch circuit being controlled by a row address strobe signal and a column address strobe signal;
   a row decoder receiving said address latched in said address latch circuit and having outputs connected to the rows of said memory cell array, respectively, for selecting a designated row from the plurality of rows of said memory cell array;
   a plurality of sense amplifiers each connected to a corresponding column of the plurality of columns of said memory cell array;
   a column decoder connected to receive an output of said address latch circuit and having a plurality of outputs connected to corresponding columns of said memory cell array, respectively, for selecting a designated column from the plurality of columns of said memory cell array;
   a read amplifier receiving an output of the sense amplifier; and
   an output circuit receiving an output of said read amplifier, said output circuit including a circuit receiving said column address strobe signal for generating a latch signal which is changed immediately when said column address strobe signal is enabled but which is changed with a delay when said column address strobe signal is disabled, a latch circuit receiving a read amplifier output signal obtained by amplifying a memory cell information, for latching said read amplifier output signal in response to said latch signal, and an output buffer receiving an output of said latch circuit, and wherein said circuit receiving said column address strobe signal includes a delay circuit receiving said column address strobe signal, and a logic gate having a first input receiving said column address strobe signal and a second input connected to an output of said delay circuit, said logic gate outputting said latch signal which is disabled immediately when said column address strobe signal is enabled but which is enabled with said delay when said column address strobe signal is disabled.

5. The semiconductor memory claimed in claim 4, wherein said logic gate is a NAND gate outputting said latch signal which is brought to a high level immediately when said column address strobe signal is brought to a low level but which is brought to the low level with said delay when said column address strobe signal is brought to the high level.

6. A semiconductor memory comprising:
a memory cell array composed of a number of memory cells arranged in the form of a matrix having a plurality of rows and a plurality of columns;
an address latch circuit receiving an external address composed of a plurality of bits, said address latch circuit being controlled by a row address strobe signal and a column address strobe signal;
a row decoder receiving said address latched in said address latch circuit and having outputs connected to the rows of said memory cell array, respectively, for selecting a designated row from the plurality of rows of said memory cell array;
a plurality of sense amplifiers each connected to a corresponding column of the plurality of columns of said memory cell array;
a column decoder connected to receive an output of said address latch circuit and having a plurality of outputs connected to corresponding columns of said memory cell array, respectively, for selecting a designated column from the plurality of columns of said memory cell array;
a read amplifier receiving an output of the sense amplifier; and
an output circuit receiving an output of said read amplifier, said output circuit including a circuit receiving said column address strobe signal for generating a latch signal which is changed immediately when said column address strobe signal is enabled but which is changed with a delay when said column address strobe signal is disabled, a latch circuit receiving a read amplifier output signal obtained by amplifying a memory cell information, for latching said read amplifier output signal in response to said latch signal, and an output buffer receiving an output of said latch circuit, and wherein said circuit receiving said column address strobe signal includes a first logic gate circuit receiving a plurality of bits of address latch output signal for generating a one-shot logical signal when any one bit of said plurality of bits of address latch output signal changes its logical level, a second logic gate circuit receiving said one-shot logical signal and said column address strobe signal for generating a logic signal activated when said one-shot logical signal is generated and said column address strobe signal is inactivated, and a flipflop receiving said logic signal and said column address strobe signal so as to generate said latch signal which is not activated if said one-shot logical signal is generated and which is activated at a time later than said column address strobe signal is inactivated, when said one-shot logical signal is generated.

* * * * *

UNITED STATES PATENT AND TRADEMARK OFFICE
CERTIFICATE OF CORRECTION

PATENT NO. : 5,436,865
DATED : July 25, 1995
INVENTOR(S) : Eiji Kitazawa

It is certified that error(s) appears in the above-identified patent and that said Letters Patent is hereby corrected as shown below:

Column 1, line 31 delete "1".

Column 2, line 57 delete "$A_0$to", insert --$A_0$ to--.

Column 2, line 66 delete "$A_0$to", insert --$A_0$ to--.

Column 5, line 19 delete "$A_0$to", insert --$A_0$ to--.

Column 5, line 27 delete "$A_0$to", insert --$A_0$ to--.

Signed and Sealed this

Sixteenth Day of January, 1996

Attest:

BRUCE LEHMAN

*Attesting Officer*  *Commissioner of Patents and Trademarks*